(12) United States Patent
Chang et al.

(10) Patent No.: US 7,790,532 B2
(45) Date of Patent: Sep. 7, 2010

(54) METHOD OF MANUFACTURING THIN FILM TRANSISTOR SUBSTRATE

(75) Inventors: Jae-Hyuk Chang, Seongnam-si (KR); Kyu-Young Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 98 days.

(21) Appl. No.: 12/324,231

(22) Filed: Nov. 26, 2008

(65) Prior Publication Data

US 2009/0209068 A1 Aug. 20, 2009

(30) Foreign Application Priority Data

Feb. 15, 2008 (KR) .................. 10-2008-0013945

(51) Int. Cl.
*H01L 21/84* (2006.01)

(52) U.S. Cl. ............................ 438/158; 257/E21.561

(58) Field of Classification Search ......... 438/151–166; 257/E21.561
See application file for complete search history.

(56) References Cited

U.S. PATENT DOCUMENTS

| 7,425,479 B2* | 9/2008 | Jeong et al. | 438/158 |
| 7,531,454 B2* | 5/2009 | Yoo et al. | 438/670 |
| 7,561,219 B2* | 7/2009 | Seo et al. | 349/43 |
| 2004/0119905 A1* | 6/2004 | Jang et al. | 349/56 |
| 2008/0032433 A1* | 2/2008 | Kang | 438/30 |

FOREIGN PATENT DOCUMENTS

| JP | 2006139249 | 6/2006 |
| KR | 1020050070243 | 7/2005 |
| KR | 1020060088616 | 8/2006 |
| KR | 1020070070712 | 7/2007 |

* cited by examiner

*Primary Examiner*—Richard A. Booth
(74) *Attorney, Agent, or Firm*—H.C. Park & Associates, PLC

(57) ABSTRACT

In a method of manufacturing a thin film transistor substrate, a gate line and a gate electrode are formed on a substrate. A gate insulating layer is formed to cover the gate line and the gate electrode. A semiconductor layer is formed on the gate insulating layer to overlap with the gate electrode. A data line, a source electrode, and a drain electrode are formed on the gate insulating layer and the semiconductor layer. A photoresist layer is formed on the data line, the source electrode, and the drain electrode. The photoresist layer is patterned, and an organic layer is formed on the substrate having the photoresist layer pattern. Then, the photoresist layer pattern is removed.

20 Claims, 8 Drawing Sheets

METHOD OF MANUFACTURING THIN FILM TRANSISTOR SUBSTRATE

CROSS-REFERENCE TO RELATED APPLICATION

This application claims priority from and the benefit of Korean Patent Application No. 10-2008-0013945, filed on Feb. 15, 2008, which is hereby incorporated by reference for all purposes as if fully set forth herein.

BACKGROUND OF INVENTION

1. Field of Invention

The present invention relates to a method of manufacturing a thin film transistor substrate used in a display apparatus.

2. Discussion of the Background

Recently, with the development of information technologies, the demand for a high performance display, which displays various types of information including images, graphics, characters, etc., to rapidly transfer the various types of information has increased.

In particular, since a liquid crystal display (LCD) may have low power consumption, may be lightweight and slim as compared with a cathode-ray tube (CRT), and may not emit harmful electromagnetic waves, the liquid crystal display has made remarkable advances as a next-generation display apparatus and has been used in various fields, such as electronic clocks, electronic calculators, personal computers (PCs), and televisions. A liquid crystal display displays images when the transmittance of light passing through liquid crystal cells, which are aligned in a liquid crystal panel in the form of a matrix, is adjusted according to video signals.

A liquid crystal display may be classified according to its light source as a transmissive LCD using an internal light source, a reflective LCD using an external light source, or a transflective LCD using both external and internal light sources. A transflective LCD displays images through a reflective mode when external light is sufficient and through a transmissive mode using a backlight unit when external light is insufficient. Accordingly, the transflective LCD may have advantages associated with a reflective LCD, such as reduced power consumption, as well as advantages associated with a transmissive LCD, such as being able to display images without external light.

In the transflective LCD, a pixel area is divided into a transmissive area and a reflective area. An embossing pattern may be formed on the reflective area to enhance reflectance. The embossing pattern may be formed through an exposure process, a development process, and a thermal reflow process using micro-exposure equipment and a special mask. However, the micro-exposure equipment and the special mask may be expensive. Therefore, an imprinting process may be used instead.

However, when using the conventional imprinting process, defects such as poor uniformity in a remaining layer and bubble defects may occur. In addition, a different master for each device may be necessary to manufacture a mold, which may increase the manufacturing costs.

SUMMARY OF INVENTION

The present invention provides a simplified method of manufacturing a thin film transistor substrate that may reduce manufacturing costs and improve display characteristics.

Additional features of the invention will be set forth in the description which follows, and in part will be apparent from the description, or may be learned by practice of the invention.

The present invention discloses a method of manufacturing a thin film transistor substrate including forming a gate line and a gate electrode on a substrate. A gate insulating layer is formed to cover the gate line and the gate electrode. A semiconductor layer is formed on the gate insulating layer to overlap with the gate electrode. A data line, a source electrode, and a drain electrode are formed on the gate insulating layer and the semiconductor layer. A photoresist layer is formed on the data line, the source electrode and the drain electrode. The photoresist layer is patterned, and an organic layer is formed on the substrate having the photoresist layer pattern. Then, the photoresist layer pattern is removed.

The present invention also discloses a method of manufacturing a thin film transistor substrate including forming a thin film transistor in a reflective area of a substrate that is divided into the reflective area and a transmissive area. A photoresist layer pattern is formed on at least a portion of the transmissive area, and on a drain electrode of the thin film transistor. An organic layer is formed on the substrate on which the photoresist layer pattern is formed. Then, the photoresist layer pattern is removed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
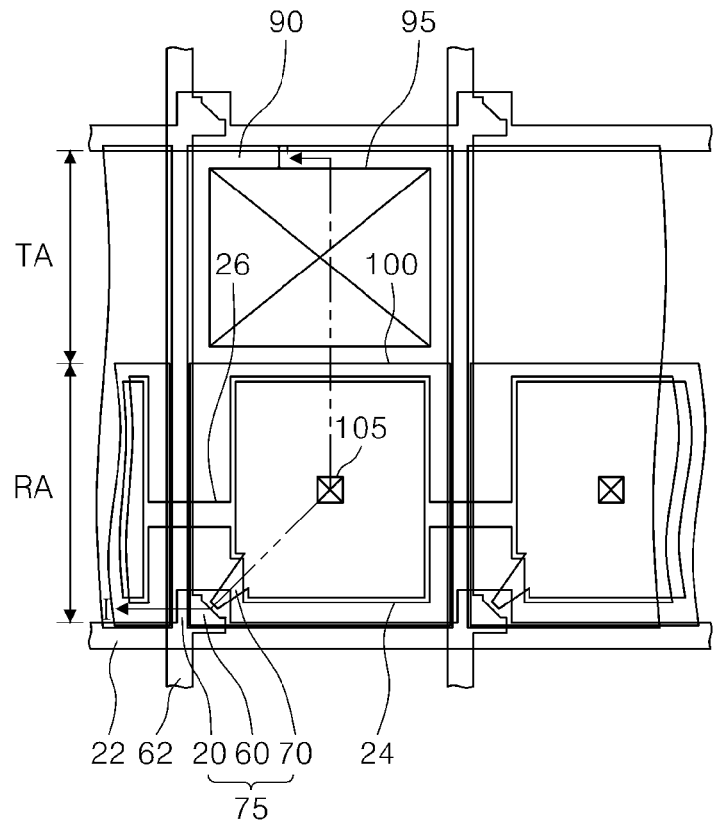
FIG. 1 is a plan view showing a thin film transistor substrate according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an," and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained in detail with reference to the accompanying drawings.

Figure 2:
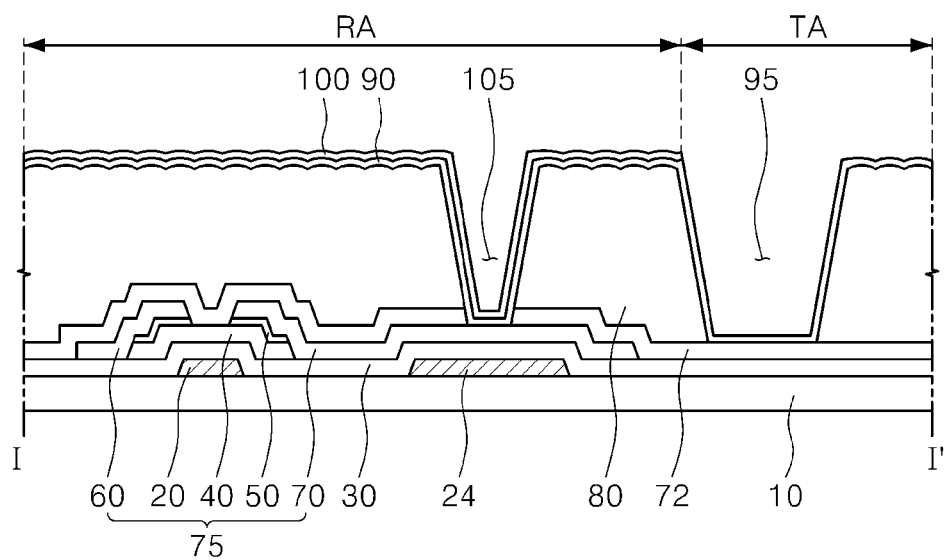
FIG. 2 is a sectional view taken along line I-I' shown in FIG. 1.

FIG. 1 is a plan view showing a thin film transistor according to an exemplary embodiment of the present invention, and FIG. 2 is a sectional view taken along line I-I' shown in FIG. 1. Exemplary embodiments of the present invention will be explained in relation to a transflective thin film transistor substrate to effectively represent characteristics of exemplary embodiments of the present invention.

Referring to FIG. 1 and FIG. 2, a thin film transistor substrate includes a substrate 10, a gate line 22, a data line 62, a thin film transistor 75, a transparent electrode 90, and a reflective electrode 100. A pixel area is defined by the gate line 22 and the data line 62, which cross each other, and is divided into a transmissive area TA and a reflective area RA. The transparent electrode 90 is formed in the transmissive area TA and the reflective area RA, and the reflective electrode 100 is formed in the reflective area RA.

In detail, the substrate 10 may be an insulating substrate including a transparent glass or a transparent plastic.

The gate line 22 is formed on the substrate 10 to provide the thin film transistor 75 with scan signals transferred from a gate drive circuit (not shown).

The data line 62 crosses the gate line 22 with a gate insulating layer 30 disposed therebetween to provide the thin film transistor 75 with a data voltage transferred from a data drive circuit (not shown).

The pixel area is divided into the transmissive area TA, which allows light generated from a backlight unit (not shown) to pass therethrough, and the reflective area RA, which reflects external light to display images. The transparent electrode 90 may be formed in both the transmissive area TA and the reflective area RA, and the reflective electrode 100 may be formed only in the reflective area RA. The reflective electrode 100 may include an opaque metallic material. Meanwhile, a storage electrode 24 of a storage capacitor Cst is formed in the reflective area RA.

The storage electrode 24 may have a wide area in the reflective area RA. Since the reflective electrode 100 may include an opaque metallic material, the storage electrode 24 may be formed over the entire area of the reflective area RA to increase the storage capacitance. The storage electrode 24 extends to an area adjacent to the gate line 22 and the data line 62 of the reflective area RA. The storage electrode 24 may be formed on the same plane as the gate line 22 using the same material as the gate line 22.

A storage line 26 is parallel to the gate line 22 to provide the storage electrode 24 with a storage voltage. The storage line 26 may be formed on the same plane as the gate line 22 using the same material as the gate line 22.

The thin film transistor 75 includes a gate electrode 20 connected to the gate line 22, the gate insulating layer 30 formed on the gate electrode 20, a semiconductor layer 40 overlapping with the gate electrode 20 on the gate insulating layer 30, a source electrode 60 connected to the data line 62 on the semiconductor layer 40, a drain electrode 70 facing the source electrode 60 on the semiconductor layer 40, and an ohmic contact layer 50 formed between the semiconductor layer 40 and the source electrode 60 and between the semiconductor layer 40 and the drain electrode 70. The drain electrode 70 extends to the reflective area RA to overlap with the storage electrode 24 with the gate insulating layer 30 disposed therebetween.

The transparent electrode 90 is connected to the drain electrode 70 through a contact hole 105 formed through an organic layer 80 covering the thin film transistor 75 and exposing the drain electrode 70. In addition, the transparent electrode 90 contacts a lower protective layer 72 through a through-hole 95 that exposes the lower protective layer 72. The transparent electrode 90 may be formed over the entire area of the pixel area.

The organic layer 80 may be formed by coating an imprinting resist. The imprinting resist may include various materials that may be patterned through an imprinting process. Accordingly, not only materials having photoresist characteristics, but also the materials having no photoresist characteristics may be used to form the organic layer 80. An embossing pattern is formed on an upper surface of the organic layer 80 to enhance the reflectance of the reflective area RA. In addition, the lower protective layer 72 is formed at a lower portion of the organic layer 80. The lower protective layer 72 improves the performance of the thin film transistor 75. The reflective electrode 100 may include an opaque conductive material and is formed on the transparent electrode 90 in the reflective area RA. Accordingly, an area where the reflective electrode 100 is not formed may serve as the transmissive area TA. The reflective electrode 100 may include the same material as the gate line 22 or the data line 62. For example, the reflective electrode 100 may include any of aluminum (Al), an aluminum alloy, molybdenum (Mo), a molybdenum alloy, and tungsten (W).

Hereinafter, a method of manufacturing a thin film transistor substrate according to an exemplary embodiment of the present invention will be described with reference to accompanying drawings.

Figure 3:
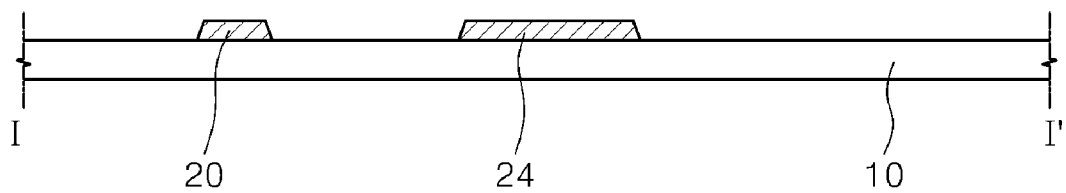
FIG. 3, FIG. 4, FIG. 5A, FIG. 5B, FIG. 6A, FIG. 6B, FIG. 6C, FIG. 6D, FIG. 6E, FIGS. 6F, 6G, FIG. 7, and FIG. 8 are process sectional views showing a method of manufacturing the thin film transistor substrate according to an exemplary embodiment of the present invention.

As shown in FIG. 3, a gate pattern is formed on the substrate 10. The gate pattern includes the gate electrode 20, the gate line 22 (see FIG. 1) connected to the gate electrode 20, the storage line 26 (see FIG. 1) formed parallel to the gate line 22, and the storage electrode 24 connected to the storage line 26.

In detail, a gate metal layer may be formed on the substrate 10, which may include glass or plastic, through a metal deposition process, such as a sputtering. The gate metal layer may include a metal such as molybdenum (Mo), titanium (Ti), copper (Cu), aluminum (Al), chrome (Cr), a molybdenum alloy, a copper alloy, and an aluminum alloy. The gate metal layer may have a single layer structure including the above material or a multi-layer structure formed by sequentially stacking at least two layers of the above material. Subsequently, the gate metal layer may be patterned through a photolithography process and an etching process using a mask, thereby forming the gate pattern including the gate electrode 20, the gate line 22, the storage line 26, and the storage electrode 24. The storage electrode 24 is formed in the reflective area RA.

Figure 4:
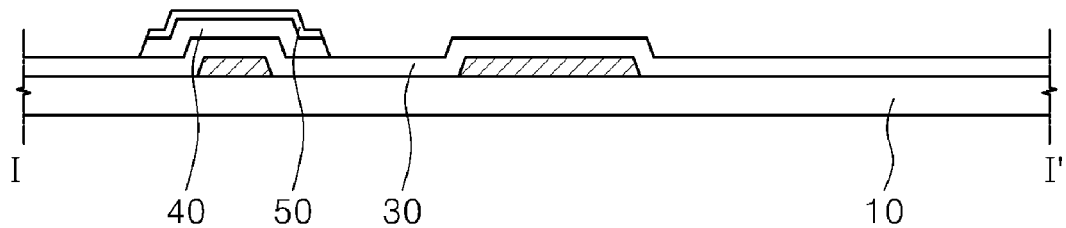

As shown in FIG. 4, the gate insulating layer 30, the semiconductor layer 40, and the ohmic contact layer 50 are formed on the gate pattern.

In detail, the gate insulating layer 30, an amorphous silicon layer, and a doped amorphous silicon layer may be formed on the substrate 10, on which the gate pattern is formed, through a deposition process such as a plasma enhanced chemical vapor deposition (PECVD) process. The gate insulating layer 30 may include inorganic insulating materials such as silicon nitride $SiN_x$ and silicon oxide $SiO_x$. After that, the amorphous silicon layer and the doped amorphous silicon layer may be patterned through a photolithography process and an etching process using a mask to form the semiconductor layer 40 and the ohmic contact layer 50.

Figure 5A:
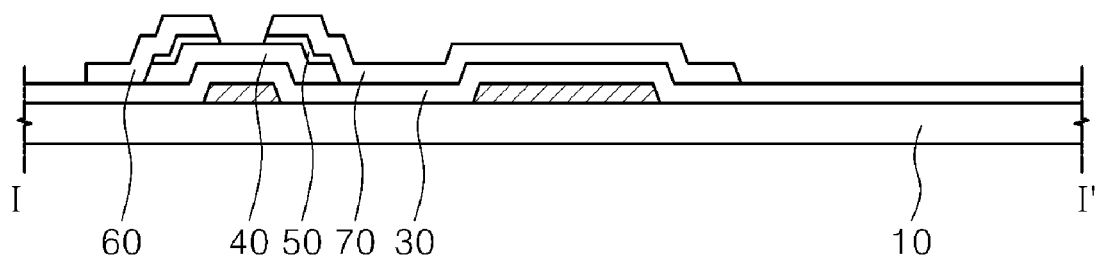

As shown in FIG. 5A, a data pattern is formed on the substrate 10, on which the semiconductor layer 40 and the ohmic contact layer 50 are formed. The data pattern includes a data line 62 (see FIG. 1), the source electrode 60, and the drain electrode 70.

Here, a data metal layer may be deposited on the gate insulating layer 30 and the ohmic contact layer 50 through a deposition process, such as a sputtering. The data metal layer may have a single layer structure or a multi-layer structure including aluminum (Al), chrome (Cr), copper (Cu), molybdenum (Mo), or an alloy thereof.

The data metal layer is patterned to form the data pattern including the data line 62, the source electrode 60, and the drain electrode 70.

Figure 5B:
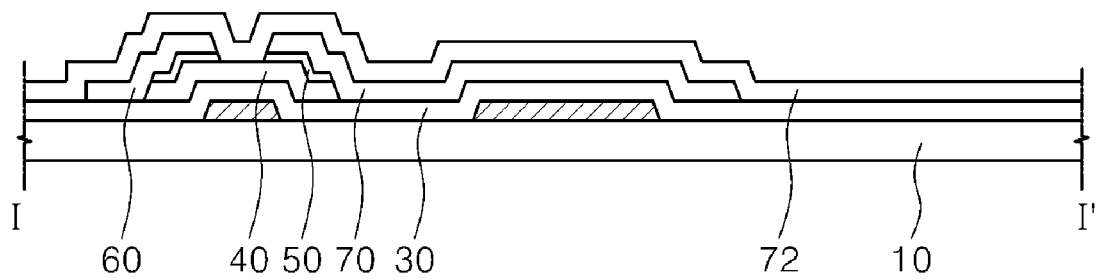

Then, as shown in FIG. 5B, the lower protective layer 72 is further formed on the data pattern. The lower protective layer 72 may include inorganic insulating materials such as silicon nitride $SiN_x$ and silicon oxide $SiO_x$, similarly to the gate insulating layer 30. The lower protective layer 72 may improve the performance of the thin film transistor 75.

Referring to FIG. 6A, FIG. 6B, FIG. 6C, FIG. 6D, FIG. 6E, and FIG. 6F, the organic layer 80 is formed on the lower protective layer 72.

Figure 6A:
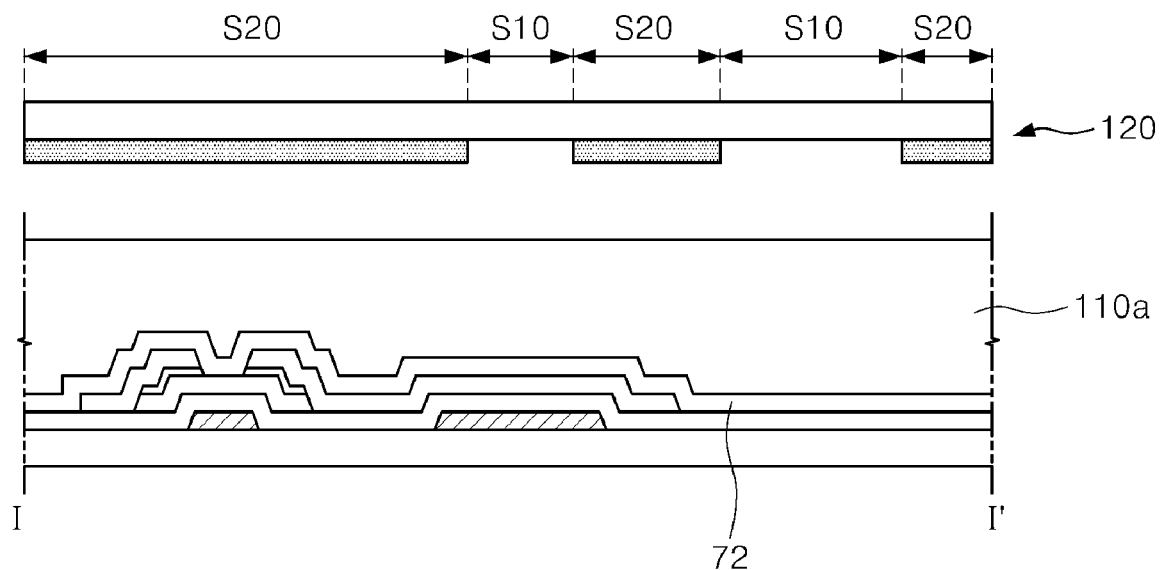
Figure 6B:
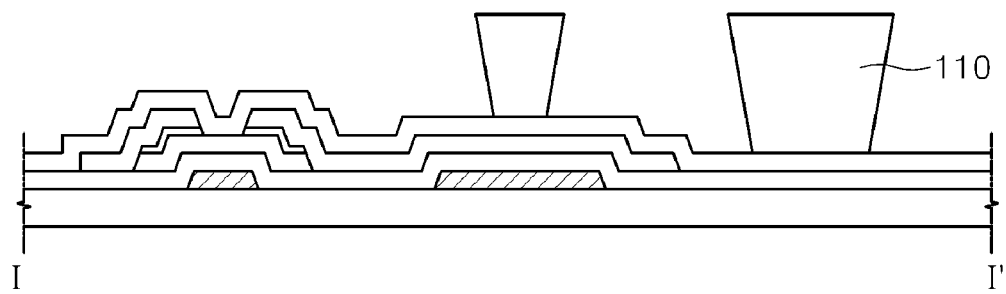

As shown in FIG. 6A, a photoresist 110a is formed on the entire surface of the lower protective layer 72. The photoresist 110a used for the present exemplary embodiment is a negative type photoresist. Then, as shown in FIG. 6B, a photoresist layer pattern 110 is formed through an exposure process and a development process using a mask 120 having a transmitting area S10 and a blocking area S20. According to the characteristics of the negative-type photoresist 110a, a portion of the negative-type photoresist 110a exposed to light is cured and remains. Accordingly, when ultraviolet rays pass through the photoresist layer 110a after passing through the transmitting area S10 of the mask 120, an exposed portion of the photoresist layer 110a may be gradually reduced from an upper portion to a lower portion of the photoresist layer 110a, so that the remaining photoresist layer pattern 110 has an inverse trapezoidal shape. Although the photoresist layer pattern 110 includes negative type photoresist in the present exemplary embodiment, the present invention is not limited thereto. That is, the photoresist layer pattern 110 may include positive type photoresist in which a portion of the photoresist layer that is not exposed to light remains.

Figure 6C:
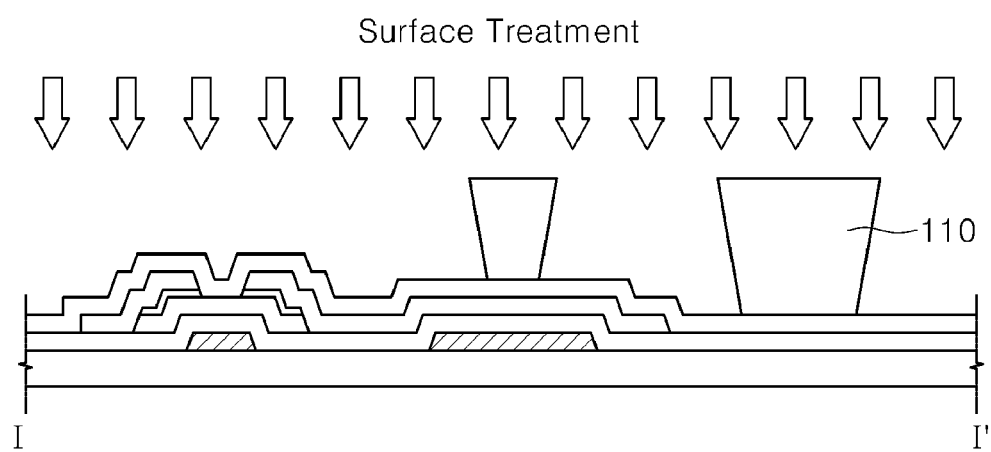

As shown in FIG. 6C, the photoresist layer pattern 110 may be subjected to a surface treatment. The surface treatment may be performed through a Hexa Methyl Di Siloxane (HDMS, $O[Si(CH_3)_3]_2$) treatment or a plasma treatment using gas including oxygen. The HDMS treatment and the plasma treatment may cause a surface of the photoresist layer pattern 110 to have hydrophobic properties and may increase surface energy of the photoresist layer pattern 110. Accordingly, a surface contact force with respect to the imprinting resist may be improved during an imprinting process.

Figure 6D:
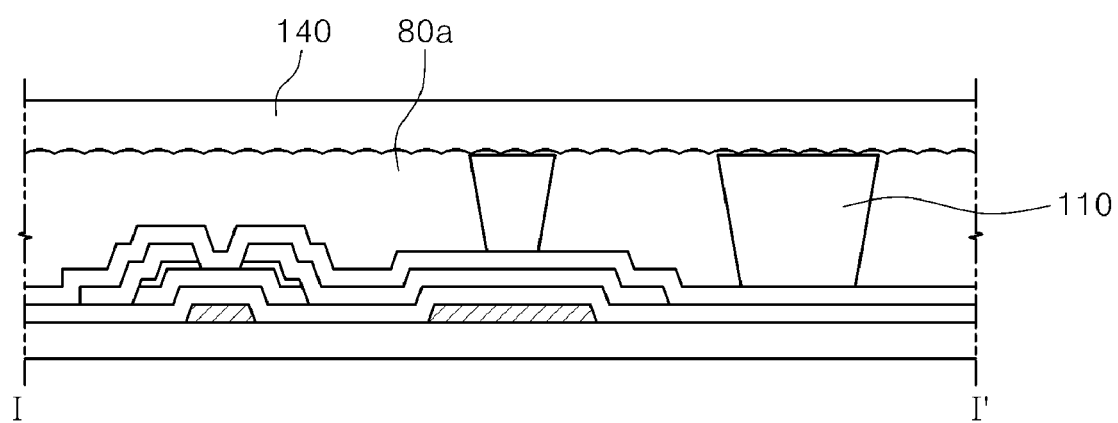
Figure 6E:
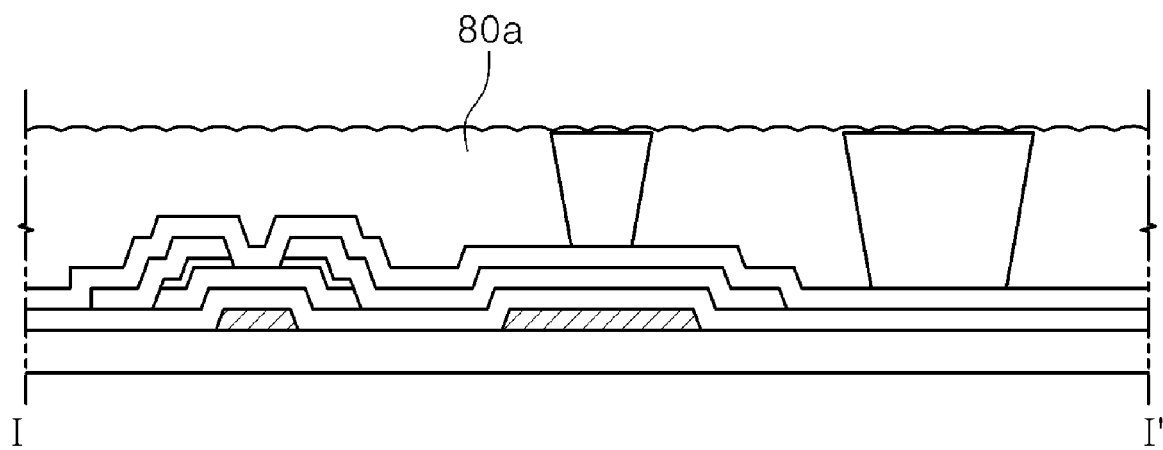

As shown in FIG. 6D, the substrate including the photoresist layer pattern 110 is coated with the imprinting resist 80a and then pressed by a mold 140 having a negative embossing pattern, so that, as shown in FIG. 6E, a positive embossing pattern is formed on an upper surface of the imprinting resist 80a corresponding to the negative embossing pattern formed on the mold 140. The mold 140 may include a polymer having elasticity. For example, the polymer may include any of PDMS (polydimethylsiloxane), silicon rubber, polyurethane, and polyimide.

Figure 6F:
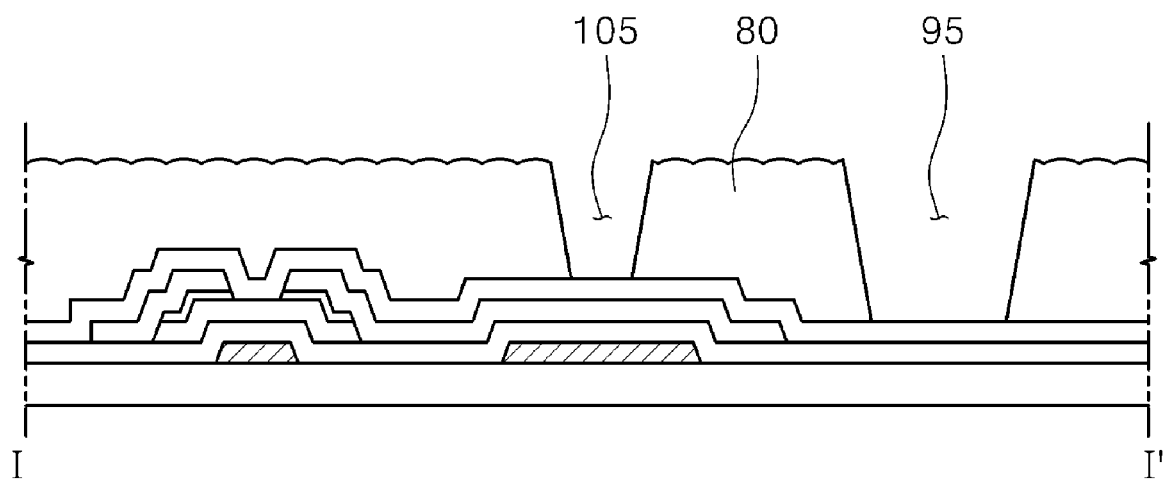

As shown in FIG. 6F, the photoresist layer pattern 110 may be removed through a lift-off process using a strip scheme, thereby forming the organic layer 80 including the contact hole 105 and the through-hole 95. Prior to the lift-off process, the photoresist layer pattern 110 is disposed on a portion corresponding to the contact hole 105 and the through-hole 95. If the photoresist layer pattern 110 and the organic layer 80 are treated with a strip solution, the photoresist layer pattern 110 may exclusively react with the strip solution so that the photoresist layer pattern 110 may be removed. Before the lift-off process is performed using the strip scheme, a remaining layer (i.e., organic layer 80a) formed at an upper surface of the photoresist layer pattern 110 may be removed. In order to remove the remaining layer from the upper surface of the photoresist layer pattern 110, an ashing process may be performed relative to the upper surface of the photoresist layer pattern 110.

Figure 6G:
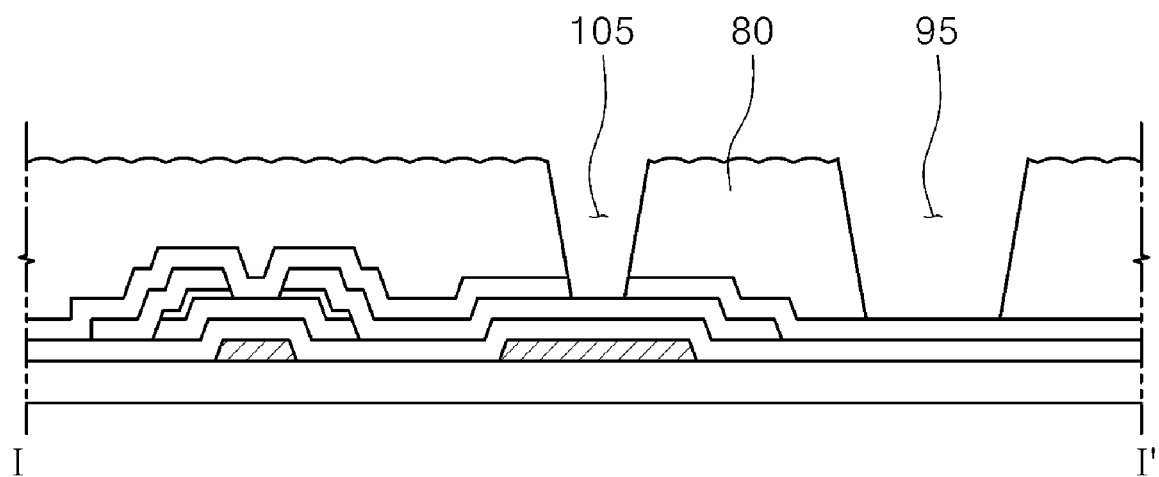

After that, as shown in FIG. 6G, the lower protect layer 72 on a portion corresponding to the contact hole 105 is patterned through a photolithography process and an etching process using a mask, thereby exposing a portion of the drain electrode 70 through the contact hole 105.

Figure 7:
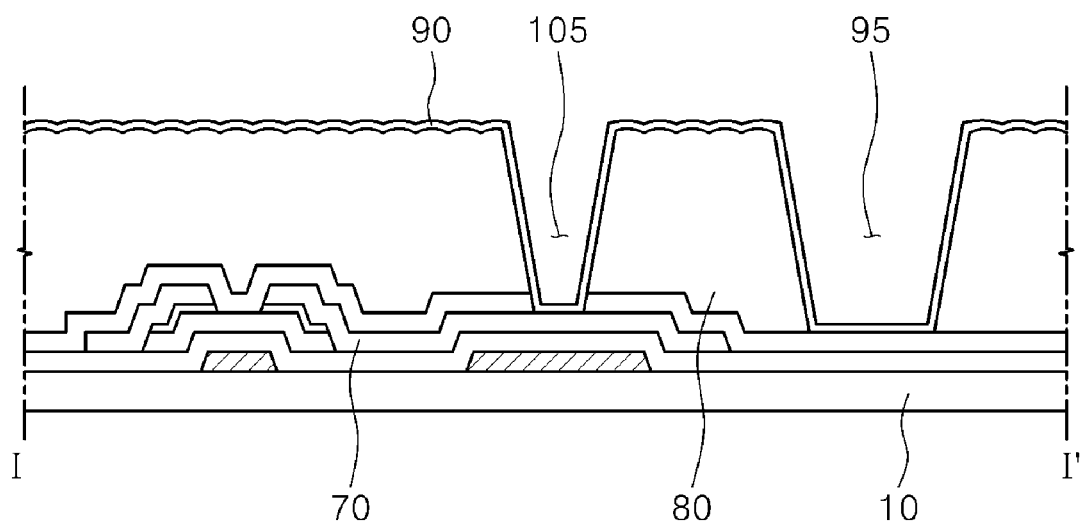

As shown in FIG. 7, the transparent electrode 90 is formed on the organic layer 80.

In detail, a transparent conductive layer may be deposited on the substrate 10, on which the organic layer 80 is formed, through a sputtering method. The transparent conductive layer may include any one of indium tin oxide (ITO), tin oxide (TO) and indium zinc oxide (IZO). Then, photoresist is coated on the transparent conductive layer and patterned using a mask to form the transparent electrode 90. The transparent electrode 90 is connected to the drain electrode 70 through the contact hole 105.

Figure 8:
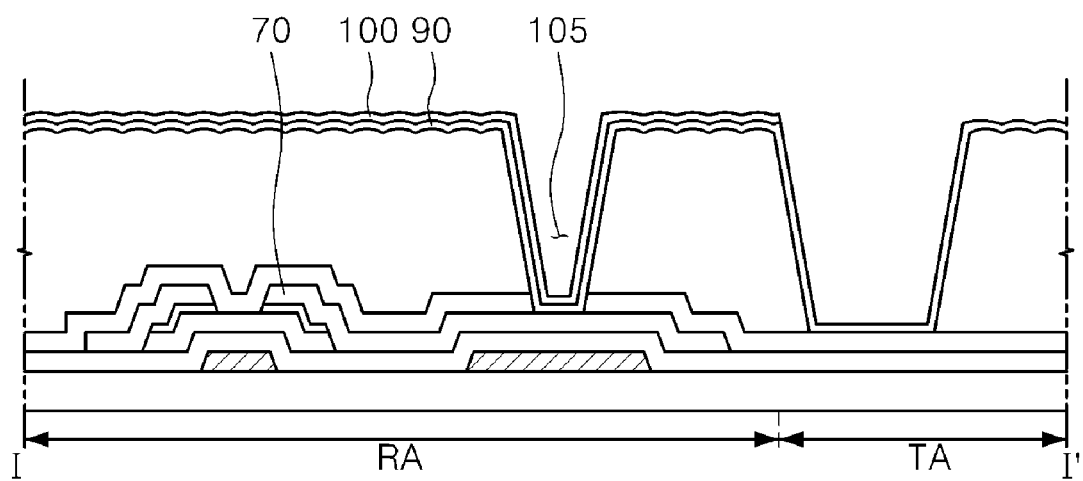

As shown in FIG. 8, the reflective electrode 100 is formed on the transparent electrode 90 in the reflective area RA.

In detail, a metal layer, which may include the same material as the gate pattern or the data pattern, is formed on the transparent electrode 90 of the reflective area RA. The metal layer may include an opaque conductive metal and/or a metal having high reflectance. Then, photoresist is coated on the metal layer and patterned. After that, an etching process is performed on the photoresist to form the reflective electrode 100 in the reflective area RA. Although the reflective electrode 100 is formed on the transparent electrode 90 in the present exemplary embodiment, the present invention is not limited thereto. Alternatively, the reflective electrode 100 may be formed on the organic layer 80 in the reflective area RA.

According to the manufacturing method of the thin film transistor substrate, the occurrence of defects, such as poor uniformity in a remaining layer or bubble defects, may be prevented during an imprinting process. In addition, since the master used to manufacture the mold may be commonly used, the manufacturing costs may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film transistor substrate, the method comprising:
   forming a gate line and a gate electrode on a substrate;
   forming a gate insulating layer to cover the gate line and the gate electrode;
   forming a semiconductor layer on the gate insulating layer to overlap with the gate electrode;
   forming a data line, a source electrode, and a drain electrode on the gate insulating layer and the semiconductor layer;
   forming a photoresist layer pattern on the data line, the source electrode, and the drain electrode;
   forming an organic layer on the substrate having the photoresist layer pattern; and
   removing the photoresist layer pattern.

2. The method of claim 1, further comprising forming an embossing pattern on an upper surface of the organic layer.

3. The method of claim 2, wherein the embossing pattern is formed through an imprinting process using a mold.

4. The method of claim 3, wherein the mold comprises a polymer having elasticity.

5. The method of claim 1, wherein forming the photoresist layer pattern comprises performing an exposure process and a development process using a mask having a transmitting area and a blocking area.

6. The method of claim 5, wherein the photoresist layer pattern comprises a negative-type photoresist.

7. The method of claim 1, further comprising:
   performing a surface treatment on the photoresist layer pattern to improve hydrophobic characteristics of an upper surface of the photoresist layer pattern prior to forming the organic layer.

8. The method of claim 7, wherein the surface treatment is performed through an Hexa Methyl Di Siloxane (HMDS) treatment or a plasma treatment.

9. The method of claim 1, wherein the organic layer comprises an organic material.

10. The method of claim 9, wherein the organic material comprises a polymer for an imprinting process.

11. The method of claim 1, further comprising forming a lower protective layer comprising an inorganic material on the data line, the source electrode, and the drain electrode prior to forming the organic layer.

12. The method of claim 11, wherein the inorganic material comprises silicon oxide ($SiO_x$) or silicon nitride ($SiN_x$).

13. The method of claim 12, wherein the gate line and the data line defines a pixel area that is divided into a transmissive area and a reflective area, further comprising:
   forming a transparent electrode on the organic layer; and
   forming a reflective electrode in the reflective area of the transparent electrode.

14. The method of claim 13, wherein the transparent electrode comprises at least one of indium tin oxide, indium zinc oxide, and tin oxide.

15. The method of claim 13, wherein the reflective electrode comprises at least one metal component selected from the group consisting of molybdenum (Mo), titanium (Ti), copper (Cu), aluminum (Al), chrome (Cr), a molybdenum alloy, a copper alloy, and an aluminum alloy.

16. The method of claim 13, wherein the transparent electrode is connected to the drain electrode through a contact hole formed through the organic layer.

17. The method of claim 1, wherein removing the photoresist layer pattern comprises lifting off the photoresist layer pattern using a strip scheme.

18. The method of claim 17, wherein removing the photoresist layer pattern further comprises ashing an upper surface of the photoresist layer pattern to remove a remaining layer from the upper surface of the photoresist layer pattern prior to lifting off of the photoresist layer pattern.

19. A method of manufacturing a thin film transistor substrate, the method comprising:
   forming a thin film transistor in a reflective area of a substrate that is divided into the reflective area and a transmissive area;
   forming a photoresist layer pattern on at least a portion of the transmissive area and on a drain electrode of the thin film transistor;
   forming an organic layer on the substrate on which the photoresist layer pattern is formed; and
   removing the photoresist layer pattern.

20. The method of claim 19, further comprising forming an embossing pattern on an upper surface of the organic layer.

* * * * *